(12) United States Patent
Nakayama et al.

(10) Patent No.: US 7,091,524 B2
(45) Date of Patent: Aug. 15, 2006

(54) SEMICONDUCTOR DEVICE AND METHOD FOR FABRICATING THE SAME

(75) Inventors: Hisashi Nakayama, Kyoto (JP); Tetsuzo Ueda, Osaka (JP); Masaaki Yuri, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 36 days.

(21) Appl. No.: 10/808,396

(22) Filed: Mar. 25, 2004

(65) Prior Publication Data
US 2004/0188693 A1    Sep. 30, 2004

(30) Foreign Application Priority Data
Mar. 25, 2003    (JP)    ............................. 2003-082422

(51) Int. Cl.
*H01L 33/00*    (2006.01)

(52) U.S. Cl. ....................... 257/94; 257/103

(58) Field of Classification Search .......... 257/94–103, 257/190
See application file for complete search history.

(56) References Cited

U.S. PATENT DOCUMENTS

| | | | |
|---|---|---|---|
| 6,447,604 B1 * | 9/2002 | Flynn et al. | ................... 117/89 |
| 6,566,231 B1 * | 5/2003 | Ogawa et al. | .............. 438/448 |
| 2001/0029086 A1 * | 10/2001 | Ogawa et al. | .............. 438/448 |
| 2003/0205721 A1 * | 11/2003 | Nishii et al. | ................ 257/194 |

FOREIGN PATENT DOCUMENTS

JP    P2001-267555 A    9/2001

OTHER PUBLICATIONS

Ok-Hyun Nam, et al., "Lateral Epitaxy of Low Defect Density GaN Layers Via Organometallic Vapor Phase Epitaxy", American Institute of Physics, Applied Physics Letters 71 (18), pp. 2638-2640, Nov. 3, 1997.

* cited by examiner

*Primary Examiner*—Cuong Nguyen
(74) *Attorney, Agent, or Firm*—McDermott Will & Emery LLP

(57) ABSTRACT

A semiconductor device has a substrate, a first Group III nitride semiconductor layer formed on the substrate, a first oxide layer formed in proximity to the upper portions of defects present in the first Group III nitride semiconductor layer, and a second Group III nitride semiconductor layer including a positive layer and formed over each of the first Group III nitride semiconductor layer and the first oxide layer.

8 Claims, 11 Drawing Sheets

SEM Image after Thermal Oxidation by Oxygen

Thickness of Oxide Layer ($Ga_2O_3$) (0 to 150 nm Max.)

SEM Image after Thermal Oxidation by Water Vapor

Thickness of Oxide Layer ($Ga_2O_3$) (0 to 45 nm Max.)

SEMICONDUCTOR DEVICE AND METHOD FOR FABRICATING THE SAME

BACKGROUND OF THE INVENTION

The present invention relates to a nitride semiconductor device for use as a blue light-emitting diode, a blue-violet laser, a high-speed transistor, or the like and to a method for fabricating the same.

A Group III nitride semiconductor ($B_zAl_xGa_{1-x-y-z}In_yN$ (where $0 \leq x \leq 1$, $0 \leq y \leq 1$, and $0 \leq z \leq 1$ are satisfied)) (hereinafter simply referred to as a nitride semiconductor) is a semiconductor having an extremely large band gap energy. For example, GaN has a band gap energy as large as 3.4 eV (at a room temperature). For this reason, a nitride semiconductor is considered to be promising as a material capable of emitting visible light ranging widely from blue to ultraviolet.

A nitride semiconductor is also considered to be promising as a transistor material capable of high-temperature and high-output operation because it has a high electron speed in a high electric field. Thus far, it has been impossible to provide a nitride semiconductor having an excellent crystal property since a growth temperature for a nitride semiconductor is generally high and there is no substrate material that can be lattice-matched thereto.

Ever since the development of a technology which grows, by metal organic chemical vapor deposition (hereinafter referred to as MOCVD), a nitride semiconductor on a sapphire substrate with a low-temperature buffer layer interposed therebetween, however, the crystal property of a nitride semiconductor has been improved and a light-emitting diode or a semiconductor laser has been produced on a commercial basis.

In general, crystal defects such as lattice defects on the order of $1 \times 10^9$ cm$^{-2}$ are present in a GaN crystal formed on a sapphire substrate as a factor causing the degradation of the characteristics and reliability of a light-emitting element or an electronic device. To solve the problem, a lower-defect technology using epitaxial lateral overgrowth (hereinafter referred to as ELO) has been developed. By epitaxially laterally overgrowing GaN on, e.g., a mask composed of an $SiO_2$ film or the like, the density of crystal defects has been reduced to the level of $1 \times 10^7$ cm$^{-2}$.

A description will be given herein below to a semiconductor device according to a first conventional embodiment with reference to FIG. 15. Specifically, the description will be given to a structure of a nitride semiconductor layer device formed by using the epitaxial lateral overgrowth technology mentioned above (see, e.g., O. H. Nam et. al., Applied Physics Letters 71 (1997) p.2638)

As shown in FIG. 15, a first GaN layer 3 is formed on a sapphire substrate 1 with a buffer layer 2 made of GaN interposed therebetween. An $SiO_2$ film 4 patterned in stripes and having a thickness of 100 nm is formed on the first GaN layer 3. A second GaN layer 5 containing crystal defects at a low density is formed on the $SiO_2$ film 4 by epitaxial lateral overgrowth (ELO) using MOCVD. Since the region of the second GaN layer 5 located on the $SiO_2$ film 4 is formed by epitaxial lateral overgrowth (ELO), it has crystal defects at a reduced density.

A laser structure is formed on the low-defect region of the second GaN layer 5 which is formed on the $SiO_2$ film 4. Specifically, an n-type clad layer 6, an active layer 7, a p-type clad layer 8, and a p-type contact layer 9 each made of a nitride semiconductor are formed and an insulating film 10 composed of, e.g., an $SiO_2$ film and having an opening is formed on the p-type clad layer 8. A p-type electrode 11 is formed over the insulating film 10 and the portion of the p-type contact layer 9 exposed in the opening 10a of the insulating film 10, while an electrode pad 12 is formed on the p-type electrode 11. On the other hand, a metal electrode 13 is formed on the n-type clad layer 6. In FIG. 15, the vertical lines extending in the first GaN layer 3, the second GaN layer 5, and the n-type clad layer 6 indicate crystal defects such as lattice defects and the number of the vertical lines indicates the number of the crystal defects. For example, the crystal defects are reduced in the region overlying the $SiO_2$ film 4 as described above and a smaller number of crystal defects are indicated by the vertical lines which are smaller in number than in the other region.

In terms of enhancing the performance of a nitride semiconductor device in addition to reducing defects described above, a technology which selectively oxidizes a surface of a GaN layer has also drawn attention as a second conventional embodiment (See, e.g., Japanese Laid-Open Patent Publication No. 2001-267555).

Specifically, a heat treatment is performed with respect to a GaN layer in an oxygen atmosphere by using an Si thin film or the like as a mask material to oxidize the surface of the GaN layer, followed by the removal of the mask material. If a field effect transistor is produced on the surface of the GaN layer thus formed, the oxide film formed on the surface of the GaN layer allows the isolation of the device and increases the breakdown voltage of the device. Such a selective oxidation technology is also applicable to current confinement in a semiconductor laser or the like and the wide application thereof is expected.

In the case of producing a nitride semiconductor laser device by using the lower-defect technology shown above in the first conventional embodiment, however, mask alignment is difficult since a waveguide structure with a width of, e.g., 2 μm should be formed in the low-crystal-defect region formed on the mask with a width of about 5 μm. To enlarge the low-crystal-defect region formed on the mask, it is necessary to increase the film thickness of the GaN layer formed on the mask. In that case, however, a crack is formed in the GaN layer due to the different thermal expansion coefficients thereof. This causes the problem of low characteristic reproducibility or low production yield in, e.g., a semiconductor laser device. To reduce crystal defects, the foregoing mask composed of the $SiO_2$ film may be formed a plurality of times but the problem is encountered that the cost for device production using a photolithographic step is increased.

According to the selective oxidation technology in the second conventional embodiment, on the other hand, the roughened surface of the GaN layer causes the following problem in the steps subsequent to the surface oxidation, which is, e.g., low reproducibility in a photolithographic step, the risk of a broken line when a metal wire is formed on the roughened surface, or the like. In the case of applying the oxide film formed by using the selective oxidation technology to a metal-oxide-semiconductor (hereinafter referred to as MOS) field effect transistor, the thickness of the gate oxide film varies under an electrode so that the reproducibility of device characteristics is degraded.

SUMMARY OF THE INVENTION

The present invention has been achieved to simultaneously solve the foregoing problems and an object of the present invention is to provide a semiconductor device with a reduced number of crystal defects and a fabrication method therefor specifically by oxidizing a nitride semiconductor under specified conditions, e.g., in an oxygen compound atmosphere without forming a mask composed of, e.g., an $SiO_2$ film or the like and provide a semiconductor device comprising a nitride semiconductor having a planarized surface and a fabrication method therefor.

To solve the foregoing problems, a first semiconductor device according to the present invention comprises: a substrate; a first Group III nitride semiconductor layer formed on the substrate; a first oxide layer formed in proximity to upper portions of defects present in the first Group III nitride semiconductor layer; and a second Group III nitride semiconductor layer including a positive layer and formed over each of the first Group III nitride semiconductor layer and the first oxide layer.

In the first semiconductor device, a low-crystal-defect region can be formed by epitaxial lateral overgrowth (ELO) over the first oxide layer since the first oxide layer is formed to cover the upper portions of crystal defects randomly appearing at the surface of the first Group III nitride semiconductor layer. In other words, the first oxide layer is formed selectively in the regions located over the upper portions of randomly appearing defects. This allows the formation of the first oxide layer for epitaxial lateral overgrowth without mask formation and provides a low-crystal-defect region over the first oxide layer formed over the upper portions of randomly appearing crystal defects so that mask alignment performed in the conventional embodiments is no more necessary.

In the first semiconductor device according to the present invention, the first oxide layer is preferably obtained by oxidizing, in an oxygen compound atmosphere, a portion of the first Group III nitride semiconductor layer which is present in proximity to the upper portions of the defects.

The arrangement enhances the planarity of the surface of the first oxide layer and thereby improves the characteristics of a device formed thereon later.

In the first semiconductor device according to the present invention, the oxygen compound is preferably water vapor.

The arrangement further enhances the planarity of the surface of the first oxide layer.

In the first semiconductor device according to the present invention, the first Group III nitride semiconductor layer and the first oxide layer include a plurality of the first Group III nitride semiconductor layers and a plurality of the first oxide layers, respectively, which are formed in alternately stacked relation under the second Group III nitride semiconductor layer and a density of defects present in each of the plurality of the first Group III nitride semiconductor layers preferably decreases gradually with an increase in distance of a position of each of the defects present therein from the substrate.

By thus repeatedly stacking unit structures each composed of the first Group III nitride semiconductor layer and the first oxide layer and thereby reducing the density of crystal defects, the density of crystal defects in the second Group III nitride semiconductor layer formed thereover can further be reduced. This further improves the characteristics of the semiconductor device.

Preferably, the first semiconductor device according to the present invention further comprises: a second oxide layer obtained by oxidizing the second Group III nitride semiconductor layer in a water vapor atmosphere and located in proximity to the positive layer.

The arrangement provides a device with more excellent characteristics since the second oxide layer with excellent surface planarity is formed in proximity to the positive layer having crystal defects at a reduced density.

In the first semiconductor device according to the present invention, the second oxide layer is preferably a current block layer formed to cover a circumference of the positive layer and thereby confine a current flowing in the positive layer.

In the first semiconductor device according to the present invention, the second oxide layer is preferably a gate oxide film of a field effect transistor formed on the positive layer.

In the first semiconductor device according to the present invention, the substrate is preferably made of sapphire, spinel, GaAs, Si, SiC, or GaN.

To solve the foregoing problems, a second semiconductor device according to the present invention comprises: a first Group III nitride semiconductor layer serving as a substrate; a first oxide layer formed in proximity to upper portions of defects present in the first Group III nitride semiconductor layer; and a second Group III nitride semiconductor layer including a positive layer and formed over each of the first Group III nitride semiconductor layer and the first oxide layer.

In the second semiconductor device, a low-crystal-defect region can be formed by epitaxial lateral overgrowth (ELO) over the first oxide layer since the first oxide layer is formed to cover the upper portions of crystal defects randomly appearing at the surface of the first Group III nitride semiconductor layer serving as a substrate. In other words, the first oxide layer is formed selectively in the regions located over the upper portions of randomly appearing defects. This allows the formation of the first oxide layer for epitaxial lateral overgrowth without mask formation and provides a low-crystal-defect region over the first oxide layer formed over the upper portions of randomly appearing crystal defects so that mask alignment performed in the conventional embodiments is no more necessary. In addition, the substrate composed of the first Group III nitride semiconductor layer is low in crystal-defect density so that the planarity of the surface of the first oxide layer is further enhanced compared with that of the surface of the first oxide layer in the foregoing first semiconductor device.

In the second semiconductor device according to the present invention, the first oxide layer is preferably obtained by oxidizing, in an oxygen compound atmosphere, a portion of the first Group III nitride semiconductor layer present in proximity to the upper portions of the defects.

The arrangement enhances the planarity of the surface of the first oxide layer and thereby improves the characteristics of a device formed thereon later.

In the second semiconductor device according to the present invention, the oxide compound is preferably water vapor.

The arrangement further enhances the planarity of the surface of the first oxide layer.

In the second semiconductor device according to the present invention, the positive layer is preferably an active layer composing a semiconductor laser device or a channel layer of a field effect transistor.

A third semiconductor device according to the present invention comprises: a Group III nitride semiconductor layer including a positive layer; and an oxide layer formed in proximity to upper portions of defects present in the Group III nitride semiconductor layer.

In the third semiconductor device, the formation of the oxide layer in proximity to the defects present in the Group III nitride semiconductor layer reduces surface roughness and thereby improves the characteristics of a device formed thereon later.

In the third semiconductor device, the positive layer is preferably an active layer composing a semiconductor laser device or a channel layer of a field effect transistor.

To solve the foregoing problems, a method for fabricating a semiconductor device according to the present invention comprises the steps of: forming a first Group III nitride semiconductor layer; and forming a first oxide layer in proximity to upper portions of defects present in the first Group III nitride semiconductor layer.

In accordance with the method for fabricating a semiconductor device, a low-crystal-defect region can be formed by epitaxial lateral overgrowth (ELO) over the first oxide layer since the first oxide layer is formed over the upper portions of crystal defects randomly appearing at the surface of the first Group III nitride semiconductor layer. In other words, the first oxide layer is formed selectively in the regions located over the upper portions of randomly appearing defects. This allows the formation of the first oxide layer for epitaxial lateral overgrowth without mask formation and the formation of a low-crystal-defect region over the first oxide layer formed over the upper portions of randomly appearing crystal defects so that mask alignment performed in the conventional embodiments is no more necessary.

Preferably, the method for fabricating a semiconductor device according to the present invention further comprises, after the step of forming the first oxide layer, the step of: forming a second Group III nitride semiconductor layer including a positive layer over each of the first Group III nitride semiconductor layer and the first oxide layer.

In the arrangement, the first oxide layer functions as a mask for promoting selective growth and suppresses the extension of the crystal defects present in the layer located under the first oxide layer into the layer located thereabove. As a result, a low-defect region is formed by epitaxial lateral overgrowth (ELO) over the first oxide layer and the characteristics of the semiconductor device are thereby improved.

In the method for fabricating a semiconductor device according to the present invention, the step of forming the first oxide layer preferably includes the step of: oxidizing, in an oxygen compound atmosphere, a portion of the first Group III nitride semiconductor layer which is present in proximity to the upper portions of the defects.

The arrangement enhances the planarity of the surface of the first oxide layer and thereby improves the characteristics of a device formed thereon later.

In the method for fabricating a semiconductor device according to the present invention, the oxygen compound is preferably water vapor.

The arrangement further enhances the planarity of the surface of the first oxide layer and thereby further improves the characteristics of a device formed thereon later.

In the method for fabricating a semiconductor device according to the present invention, the first oxide layer is preferably formed to have a film thickness which is larger at a position closer to each of the defects and decreases with distance from the defect.

The arrangement enhances the function of the first oxide layer as a mask for promoting selective growth so that the extension of the crystal defects present in the layer located under the first oxide layer into the layer located thereover is further suppressed.

In the method for fabricating a semiconductor device according to the present invention, the step of forming the first Group III nitride semiconductor layer and the step of forming the first oxide layer are preferably alternately repeated.

By thus repeatedly stacking unit structures each composed of the first Group III nitride semiconductor layer and the first oxide layer and thereby reducing the density of crystal defects, the density of crystal defects in the second Group III nitride semiconductor formed thereon can further be reduced. This further improves the characteristics of the semiconductor device.

Preferably, the method for fabricating a semiconductor device according to the present invention further comprises, after the step of forming the second Group III nitride semiconductor layer, the step of: forming a second oxide layer by oxidizing the second Group III nitride semiconductor layer in proximity to the positive layer in the second Group III nitride semiconductor layer.

In the arrangement, the second oxide layer with excellent surface planarity is formed in proximity to the positive layer having crystal defects at a reduced density so that a device with more excellent characteristics is implemented.

In the method for fabricating a semiconductor device according to the present invention, the second oxide layer is preferably formed in stripes.

Preferably, the method for fabricating a semiconductor device according to the present invention further comprises, between the step of forming the first oxide layer and the step of forming the second Group III nitride semiconductor layer, the step of: partly removing the first oxide layer by a heat treatment performed in an atmosphere containing an active gas and thereby exposing an upper surface of the first Group III nitride semiconductor layer.

By thus exposing the upper surface of the first Group III nitride semiconductor layer, the epitaxial lateral overgrowth can positively be promoted over the first oxide layer.

In the method for fabricating a semiconductor device according to the present invention, the active gas is preferably ammonia.

In the method for fabricating a semiconductor device according to the present invention, the first Group III nitride semiconductor layer is removed after forming the second Group III nitride semiconductor layer.

DETAILED DESCRIPTION OF THE INVENTION

Figure 1:
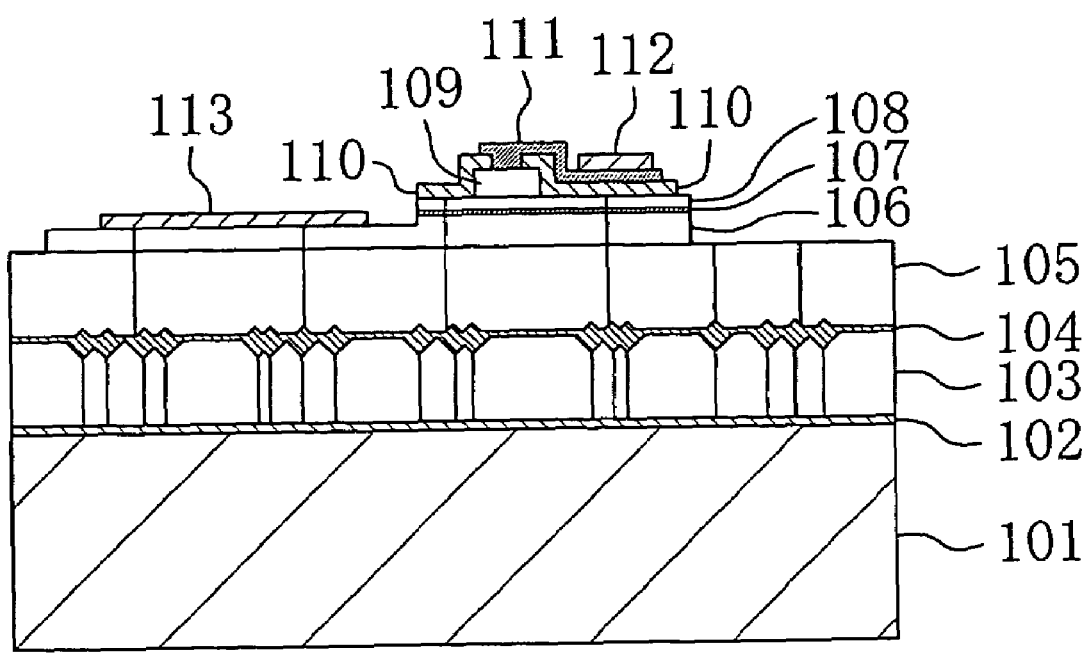
FIG. 1 is a cross-sectional view showing a structure of a semiconductor device according to a first embodiment of the present invention.

Referring to the drawings, the individual embodiments of the present invention will be described herein below.

Embodiment 1

Semiconductor Device

A semiconductor device according to a first embodiment of the present invention and a fabrication method therefor will be described with reference to FIG. 1.

FIG. 1 is a cross-sectional view showing a structure of the semiconductor device according to the first embodiment, specifically showing a structure of a semiconductor laser device by way of example.

As shown in FIG. 1, a buffer layer 102 made of GaN grown by MOCVD at a low temperature is formed on a sapphire substrate 101. A first GaN layer 103 serving as an underlying layer of a second GaN layer 105, which will be described later, is formed by MOCVD on the buffer layer 102. The density of crystal defects such as lattice defects in the first GaN layer 103 is $1 \times 10^9$ cm$^{-2}$ or more.

A first oxide layer 104 is formed on the first GaN layer 103. Specifically, the first oxide layer 104 is formed in proximity to the upper portion of the crystal defects present in the first GaN layer 103. The film thickness of the first oxide layer 104 is larger at a position closer to the upper portion of each of the crystal defects in the first GaN layer 103 and decreases gradually with distance from the upper portion of the crystal defect. The reason why the first oxide layer 104 is formed in proximity to the upper portions of the crystal defects present in the first GaN layer 103 will be described later in the description of a method for fabricating the semiconductor device.

A second GaN layer 105 has been formed on the first oxide layer 104 by regrowing the first GaN layer 103 by MOCVD. The density of crystal defects in the second GaN layer 105 is about $3 \times 10^6$ cm$^{-2}$. The reason for the density of the crystal defects thus reduced in the second GaN layer 105 is that the first oxide layer 104 functions as a mask for promoting selective growth. Consequently, the region of the second GaN layer 105 which is formed on the first oxide layer 104 becomes a low-crystal-defect region by epitaxial lateral overgrowth and suppresses the extension of the crystal defects from the first GaN layer 103.

Although the vertical lines extending in the first GaN layer 103, the second GaN layer 105, an n-type GaN clad layer 106 which will be described later, and the like in FIG. 1 are the same as those described above in that they represent crystal defects such as lattice defects, no signs are assigned thereto for the avoidance of intricacy. The same shall apply to the drawings referred to in the following description.

An n-type clad layer 106 made of GaN doped with Si is formed on the second GaN layer 105. An active layer 107 composed of an AlGaN/GaN/InGaN multilayer film is formed on the n-type clad layer 106. A p-type clad layer 108 made of GaN doped with Mg is formed on the active layer 107 and a p-type contact layer 109 made of GaN with a width of 1 to 2 μm is formed on the p-type clad layer 108. An insulating film 110 composed of an SiO$_2$ film having a thickness of 300 nm and an opening is formed in such a manner as to catch the p-type contact layer 109 therein. A p-type electrode 111 having an ohmic property is formed over the insulating film 110 and the portion of the p-type contact layer 109 exposed in the opening of the insulating film 110 and a p-type pad 112 is formed on the p-type electrode 111. On the other hand, an n-type electrode 113 is formed on the n-type clad layer 106. The structure of the semiconductor laser device is as described above.

Thus, in the semiconductor device according to the first embodiment, the first oxide layer 104 is formed to cover the upper portions of crystal defects randomly appearing at the surface of the first GaN layer 103 and the second GaN layer 105 is formed with the low-crystal-defect region by epitaxial lateral overgrowth (ELO). Since the first oxide layer 104 is formed selectively over the upper portions of randomly appearing crystal defects, the first oxide layer 104 for epitaxial lateral overgrowth can be formed without necessitating mask formation and the density of crystal defects can be reduced in the region located over the first oxide layer 104 formed over the upper portions of randomly appearing crystal defects so that mask alignment performed in the conventional embodiments is no more necessary.

Method for Fabricating Semiconductor Device

A description will be given next to a method for fabricating a semiconductor device according to the first embodiment with reference to FIGS. 2A to 2D.

FIGS. 2A to 2D are cross-sectional views illustrating the individual process steps of the method for fabricating the semiconductor device according to the first embodiment, specifically the semiconductor laser device described above.

Figure 2A:
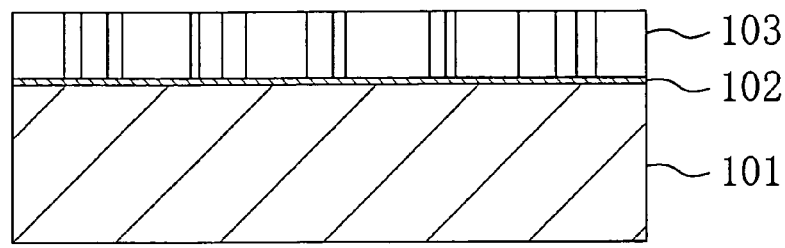
FIGS. 2A to 2D are cross-sectional views illustrating the individual process steps of a method for fabricating the semiconductor device according to the first embodiment.

As shown in FIG. 2A, the buffer layer 102 made of GaN with a thickness of 40 nm is grown by MOCVD on the sapphire substrate 101 and the first GaN layer 103 with a thickness of 0.2 μm is formed by continuing the growth of the buffer layer 102 by MOCVD.

Figure 2B:
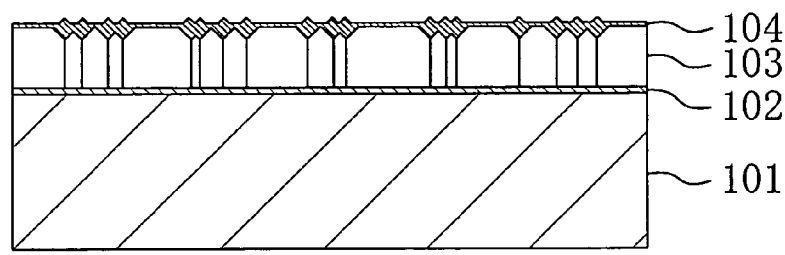

Next, as shown in FIG. 2B, an oxidation temperature is raised to 1000° C. in an oxygen compound atmosphere, e.g., an atmosphere composed of nitrogen and water vapor. By retaining the condition for 90 minutes, the first GaN layer 103 is oxidized so that the first oxide layer 104 is formed in proximity to the upper portions of the crystal defects present in the first GaN layer 103. The film thickness of the first oxide layer 104 is about 45 nm in the region in which the crystal defects present in the first GaN layer 103 have not reached the vicinity of the surface thereof, while it is about 250 nm in the region in which the crystal defects present in the first GaN layer 103 have reached the vicinity of the surface thereof. Thus, the first oxide layer 104 is formed to be thicker in the vicinity of the upper portions of the crystal defects in the first GaN layer 103, while it is formed to be thinner with distance from the vicinity of the upper portions of the crystal defects.

Next, the first oxide layer 104 is partly removed by heating it at, e.g., 900° C. in an active gas such as, e.g., $NH_3$ or HCL, though it is not depicted, whereby the surface of the first GaN layer 103 is exposed.

Figure 2C:
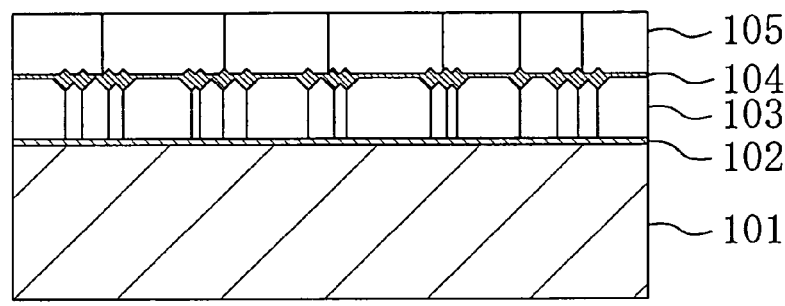

Next, as shown in FIG. 2C, the second GaN layer 105 is formed to have a film thickness of 1 μm by regrowing the first GaN layer 103 by MOCVD. At this time, the region of the first GaN layer 103 located under the thicker portion of the first oxide layer 104 (the region of the first GaN layer 103 in which the crystal defects have reached the vicinity of the surface thereof) does not grow directly but the region of the first GaN layer 103 located under the thinner portion of the first oxide layer 104 or the exposed region of the first GaN layer 103 (the region of the first GaN layer 103 in which the crystal defects have not reached the vicinity of the surface thereof) overgrows laterally to cover the first oxide layer 104. As a result, crystal defects are reduced in the region located over the first oxide layer 104.

Figure 2D:
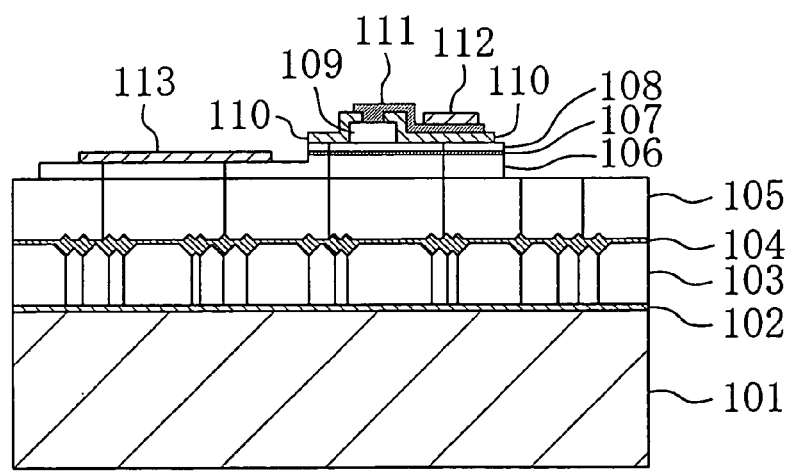

Next, as shown in FIG. 2D, the n-type clad layer 106 composed of the GaN layer doped with Si is formed on the second GaN layer 105 and the active layer 107 composed of the AlGaN/GaN/InGaN multilayer film is formed on the n-type clad layer 106. Then, the p-type clad layer 108 made of GaN doped with Mg is formed on the active layer 107 and then the p-type contact layer 109 made of GaN with a width of 1 to 2 μm is formed on the p-type clad layer 108. Subsequently, the insulating film 110 composed of the $SiO_2$ film with a thickness of 300 m and having the opening is formed on the p-type clad layer 108 in such a manner as to catch the p-type contact layer 109 therein. The p-type electrode 111 having the ohmic property is formed over the insulating film 110 and the p-type contact layer 109 exposed in the opening of the insulating film 110 and the p-type pad 112 is formed on the p-type electrode 111, while the n-type electrode 113 having the ohmic property is formed on the n-type clad layer 106, whereby the semiconductor laser device is fabricated.

Thus, in accordance with the method for fabricating the semiconductor device according to the first embodiment, the first oxide layer 104 is formed to cover the upper portions of crystal defects randomly appearing at the surface of the first GaN layer 103 so that the second GaN layer 105 forms the low-crystal-defect region by epitaxial lateral overgrowth (ELO) over the first oxide layer 104. Since the first oxide. layer 104 is formed selectively in the regions located over the upper portions of randomly appearing crystal defects, the first oxide layer 104 for epitaxial lateral overgrowth can be formed without necessitating mask formation and the region located over the first oxide layer 104 formed over the upper portions of randomly appearing crystal defects becomes the low-crystal-defect region so that mask alignment performed in the conventional embodiments is no more necessary.

Figure 3:
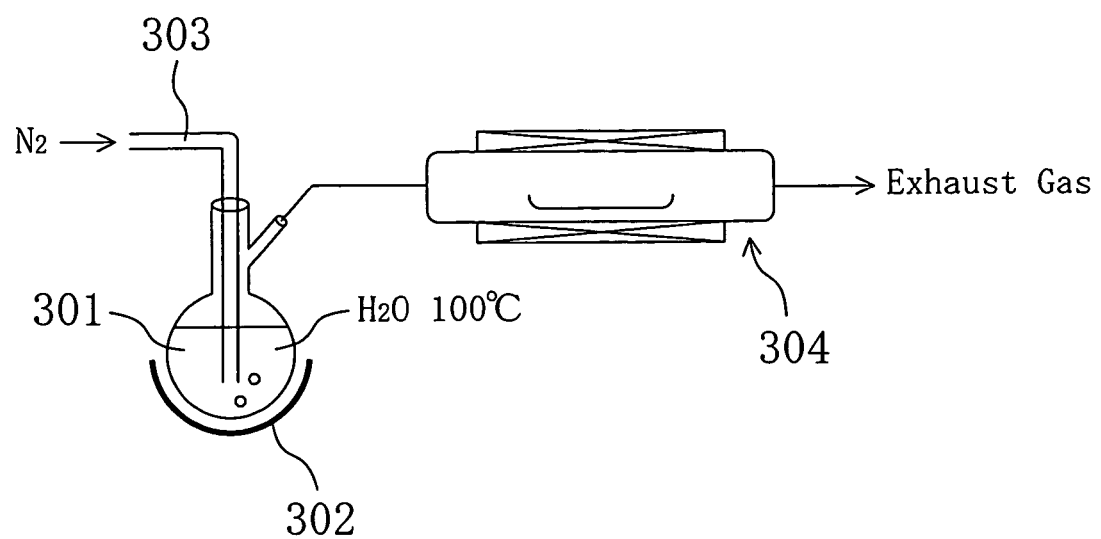
FIG. 3 is a cross-sectional view of a system for performing oxidation in a water vapor atmosphere in the first embodiment.

As an oxidation method for the first oxide layer 104, an example of a system for performing, e.g., oxidation by water vapor will be described with reference to FIG. 3. FIG. 3 is a cross-sectional view of the system for performing water vapor oxidation.

As shown in FIG. 3, ultrapure water is contained in a flask 301 and heated by a heater 302. By bubbling nitrogen from a nitrogen line 303, a gas mixture of nitrogen and water vapor can be supplied to an oxidation furnace 304. A sample is introduced into the oxidation furnace 304 and thermally treated to 1000° C. at the maximum so that the foregoing first oxide layer 104 shown in FIG. 1 or FIG. 2B is formed.

A description will be given herein below to a comparison between the case where oxidation is performed in an oxygen atmosphere and the case where oxidation is performed in a water vapor atmosphere with reference to FIGS. 4A, 4B, and 5.

Figure 4A:
FIG. 4A is a cross-sectional view showing a SEM image when a GaN layer is oxidized in an oxygen atmosphere and FIG. 4B is a cross-sectional view showing a SEM image when a GaN layer is oxidized in a water vapor atmosphere.
Figure 4B:

Of FIGS. 4A and 4B, FIG. 4A shows a SEM image in a cross section of an oxide layer ($Ga_2O_3$) when the GaN layer formed on the sapphire substrate via the buffer layer was oxidized in the oxygen atmosphere and FIG. 4B shows a SEM image in a cross section of an oxide layer ($Ga_2O_3$) when the GaN layer formed on the sapphire substrate via the buffer layer was oxidized in the water vapor atmosphere. A SEM image is a photograph taken by using a scanning electron microscope (SEM).

As is obvious from FIG. 4A, the surface of the oxide layer is roughened after the thermal oxidation by oxygen. By contrast, the oxide layer after the thermal oxidation by water vapor is formed thick over the portion of the GaN layer in which a crystal defect has reached the vicinity thereof, while the planar oxide layer is formed evenly over the portion of the GaN layer where no crystal defect is present, as shown in FIG. 4B.

Figure 5:
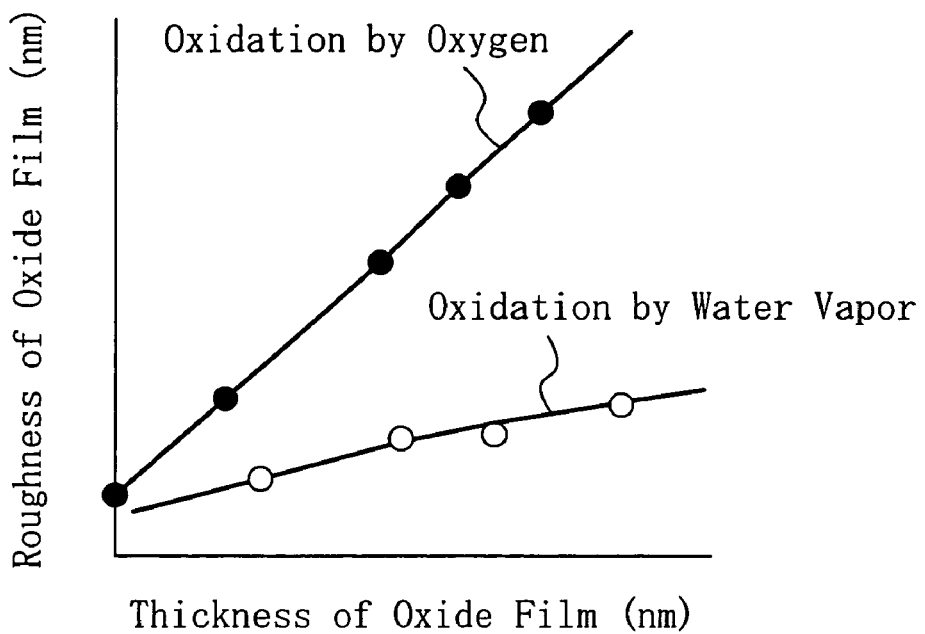
FIG. 5 is a view showing a relationship between the thickness of each of individual oxide films and surface roughness when oxidation is performed by using oxygen and water vapor.

FIG. 5 shows a relationship between the film thickness (nm) of the oxide layer and the surface roughness (nm) when oxidation was performed by using oxygen or water vapor at 900° C.

As is obvious from FIG. 5, the surface roughness of the oxide layer increased as the film thickness of the oxide layer increased when oxidation was performed by using oxygen. When oxidation was performed by using water vapor, however, the increase of the surface roughness of the oxide layer is smaller than that of the oxide layer when oxidation was performed by using oxygen. Thus, the oxide film excellent in the uniformity of surface roughness can be formed when oxidation is performed by using water vapor. If an oxide layer obtained through oxidation using water vapor is used, therefore, excellent device characteristics can be implemented.

That is, if a device is formed on an oxide layer with excellent planarity obtained through oxidation using water vapor, the characteristics of the device are improved. For example, if the oxide layer obtained through oxidation using water vapor is applied to the gate oxide film of a field effect transistor, transistor characteristics can be obtained with high reproducibility. If the oxide layer obtained through oxidation using water vapor is applied to the isolation of a transistor, an integrated circuit free of a broken line can be produced when a metal wire is formed on the oxide layer.

In the present embodiment described above, the first GaN layer 103 may have a portion on which the first oxide layer 104 is not formed. It follows that, in that case, there should be a portion where the first GaN layer 103 is in contact with the second GaN layer 105.

In the present embodiment, the first oxide layer 104 is formed thick in proximity to the upper portions of the crystal defects present in the first GaN layer 103 such that the portion of the first oxide layer 104 having a larger film thickness which is formed in proximity to one of the crystal defects and the portion thereof having a larger thickness which is formed in proximity to another adjacent crystal defect come in contact with each other to form a single oxide layer region. When the second GaN layer 105 is regrown on the first oxide layer 104, the first oxide layer 104 functions as a mask for promoting selective growth so that GaN grows from the thinner region of the first oxide layer 104 overlying the region of the first GaN layer with no crystal defect or from the region thereof where the first oxide layer 104 does not exist. Consequently, the growing GaN extends laterally in a region located over the first oxide layer 104 to provide the second GaN layer 105 lower in the density of crystal defects than the first GaN layer 103.

It is also possible to form the second GaN layer 105 by regrowing the first GaN layer 103 after etching away the thinner portion of the first oxide layer 104 in an active gas such as, e.g., $NH_3$ gas or HCL gas.

Although the present embodiment has used GaN for the nitride semiconductor layer serving as an underlie (GaN layer 103), it is also possible to use AlGaN or InGaN, which is a mixed crystal, as a nitride semiconductor serving as an underlie. Instead of GaN, a mixed crystal represented by $Al_xGa_{1-x}N$ ($0 \leq x \leq 1$) or $In_xGa_{1-x}N$ ($0 \leq x \leq 1$) may be used or a quaternary mixed crystal of AlGaInN may also be used. For the nitride semiconductor layer to be grown on the first oxide layer 104 also, a mixed crystal represented by $Al_xGa_{1-x}N$ ($0 \leq x \leq 1$) or $In_xGa_{1-x}N$ ($0 \leq x \leq 1$) may be used. The same shall apply to the equivalent nitride semiconductor layers used in the following variations of the first embodiment and a second embodiment according to the present invention, which will be described later.

It is also possible to use another material for the first oxide layer 104 provided that it can form a mask through oxidation. The nitride semiconductor composing the second GaN layer 105 which is formed by regrowth may also be a mixed crystal of Al and Ga or In and Ga.

Although the sapphire substrate 101 has been shown as an example of a substrate serving as an underlie, a spinel substrate, a GaAs substrate, an Si substrate, or an SiC substrate may also be used instead. Since the GaAs substrate, the Si substrate, or the SiC substrate has conductivity, if one of these substrates is used, an electrode can be provided on the back surface of the substrate.

It is also possible to use another material for the first GaN layer 103 provided that a mask such as the first oxide layer 104 can be formed on the first GaN layer 103. Instead of GaN, AlGaN or InGaN may also be used.

Although the method which performs a heat treatment in an active gas such as $NH_3$ gas or HCl gas in the step of partly removing the first oxide layer 104 has been described by way of example, dry etching using, e.g., $BCl_3$ gas or the like or wet etching using KOH may also be performed instead provided that it can partly remove the first oxide layer 104. It is also possible to partly remove the first oxide layer 104 by polishing.

A description will be given herein below to the variations of the first embodiment with reference to FIGS. 6 to 8.

Variation 1 of Embodiment 1

Figure 6:
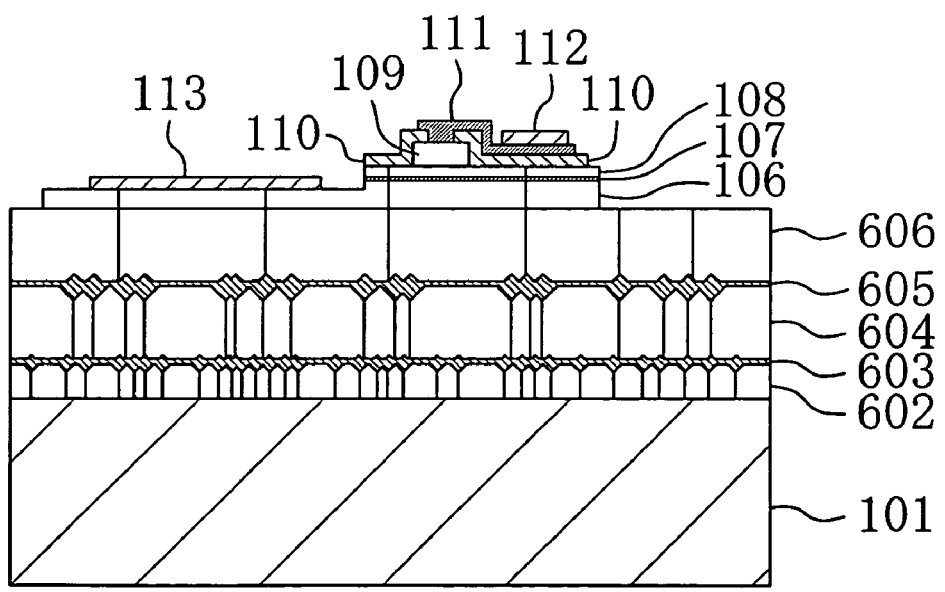
FIG. 6 is a cross-sectional view showing a structure of a semiconductor device according to a first variation of the first embodiment.

FIG. 6 is a cross-sectional view of a semiconductor device (semiconductor laser device) according to a first variation of the first embodiment. In FIG. 6, the same reference numerals are retained to designate components which are the same as those of the semiconductor device shown in FIG. 1 and the description thereof will not be repeated herein below.

The following is a difference between the semiconductor device shown in FIG. 6 and the semiconductor device shown in FIG. 1.

That is, a first GaN layer 602 is grown directly on the sapphire substrate 101 without the intervention of a buffer layer in the semiconductor device shown in FIG. 6. A GaN layer 604 and an oxide layer 605 are formed between a first oxide layer 603 and a second GaN layer 606 formed on the first GaN layer 602. The oxide layer 605 is formed through oxidation in an oxygen compound atmosphere (which is a water vapor atmosphere herein), similarly to the first oxide layer 603, and located in proximity to the upper portions of crystal defects present in the GaN layer 604. Since the oxide layer 605 is thus further formed on the GaN layer 604 having crystal defects at a reduced density, the density of crystal defects in the second GaN layer 606 formed on the oxide layer 605 is further reduced. By thus alternately and repeatedly forming a plurality of GaN layers and a plurality of oxide layers, the density of crystal defects can further be reduced in a region at a larger distance from the substrate.

Although FIG. 6 shows the structure obtained by stacking the two unit structures each composed of a GaN layer and an oxide layer, it is also possible to use a structure obtained by stacking a larger number of unit structures each composed of a GaN layer and an oxide layer.

Variation 2 of Embodiment 1

Figure 7:
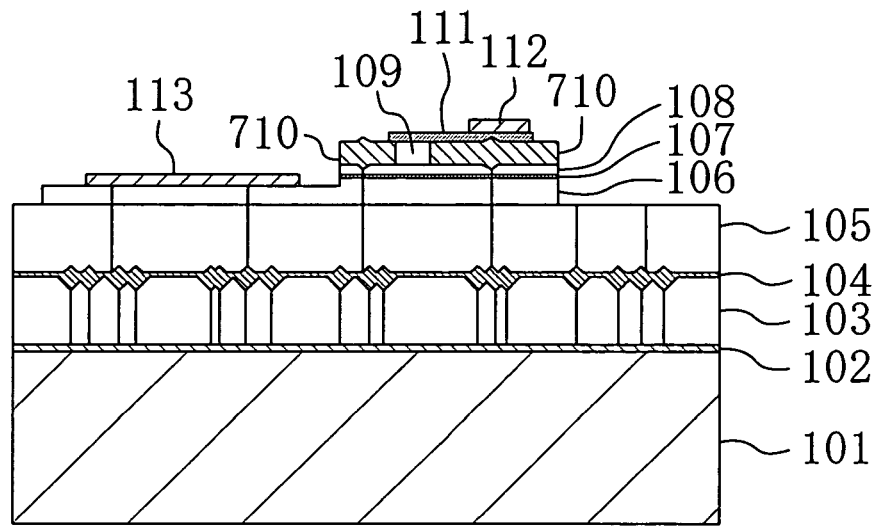
FIG. 7 is a cross-sectional view showing a structure of a semiconductor device according to a second variation of the first embodiment.

FIG. 7 is a cross-sectional view of a semiconductor device (semiconductor laser device) according to a second variation of the first embodiment. In FIG. 7, the same reference numerals are retained to designate components which are the same as those of the semiconductor device shown in FIG. 1 and the description thereof will not be repeated herein below.

The following is a difference between the semiconductor device shown in FIG. 7 and the semiconductor device shown in FIG. 1.

That is, an insulating film 710 (corresponding to the second oxide layer) is formed on both sides of the p-type contact layer 109 made of GaN in the semiconductor device shown in FIG. 7. Specifically, the semiconductor device shown in FIG. 7 is different from the semiconductor device shown in FIG. 1 in that it has the insulating film 710 formed by oxidizing a nitride semiconductor (which is GaN herein) in an oxygen compound atmosphere (which is a water vapor atmosphere herein). The insulating film 710 composes a waveguide and a current confinement layer in the semiconductor laser device. Since the surface of the insulating film 710 formed through oxidation by water vapor have thus been planarized, the characteristics of the device formed thereon can be improved.

Variation 3 of Embodiment 1

Figure 8:
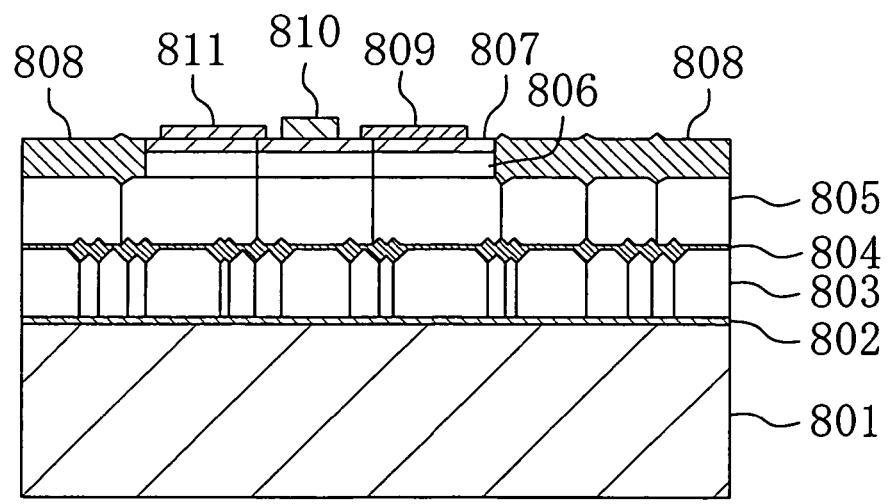
FIG. 8 is a cross-sectional view showing a structure of a semiconductor device according to a third variation of the first embodiment.

FIG. 8 is a cross-sectional view of a semiconductor device (hetero field effect transistor device) according to a third variation of the first embodiment. In FIG. 8, the same reference numerals are retained to designate components which are the same as those of the semiconductor device shown in FIG. 1 and the description thereof will not be repeated herein below.

In contrast to the second variation which has described the semiconductor laser device as an example of the semiconductor device, the third variation will describe the hetero field effect transistor (HFET) operable with a reduced leakage current and a high electric field, which has been implemented by forming an active region in a low-crystal-defect substrate.

As shown in FIG. 8, a buffer layer 802 made of GaN grown by MOCVD at a low temperature is formed on a sapphire substrate 801. A first GaN layer 803 serving as an underlying layer of a second GaN layer 805, which will be described later, is formed by MOCVD on the buffer layer 802. A first oxide layer 804 is formed on the first GaN layer 803. Thus far, the description has been the same as that given above with reference to FIG. 1.

The second GaN layer 805 made of undoped GaN is formed on the first oxide layer 804 by regrowing the first GaN layer by MOCVD. A third GaN layer 806 made of undoped GaN and an n-type channel layer 807 made of GaN are formed on the second GaN layer 805. An insulating layer 808 obtained by thermally oxidizing (oxidation in, e.g., a water vapor atmosphere is preferred herein) the third GaN layer 806 and the n-type channel layer 807 are formed on both sides of the third GaN layer 806 and the n-type channel layer 807. A source electrode 809, a gate electrode 810, and a drain electrode 811 are further formed on the n-channel layer 807. The insulating layer 808 also functions as an isolation.

The arrangement not only achieves the same effects as achieved by the first semiconductor device and the fabrication method therefor but also improves the characteristics of a device formed on the insulating film 808 in the subsequent steps since the insulating film 808 with excellent surface planarity has been formed by thermal oxidation.

In the third variation, the gate electrode 810 may also be formed on the n-type channel layer 807 with an interlayer insulating film interposed therebetween. In that case, an insulating film obtained by, e.g., oxidizing the GaN layer (i.e., a gate oxide film), preferably an insulating film obtained by performing oxidation using water vapor with respect to the GaN layer, may also be used as the interlayer insulating film.

Even if a field effect transistor using an n-type channel layer made of GaN and an n-type barrier layer made of AlGaN instead of the third GaN layer 806 and the n-type channel layer 807, i.e., a hetero field effect transistor (HFET) device is used as the foregoing field effect transistor, the same effects as described above are achievable.

The same effects as described above are also achievable even when a bipolar transistor or a heterojunction bipolar transistor composed of a nitride semiconductor is used instead of the foregoing field effect transistor.

Embodiment 2

A semiconductor device according to a second embodiment of the present invention will be described with reference to FIG. 9.

Figure 9:
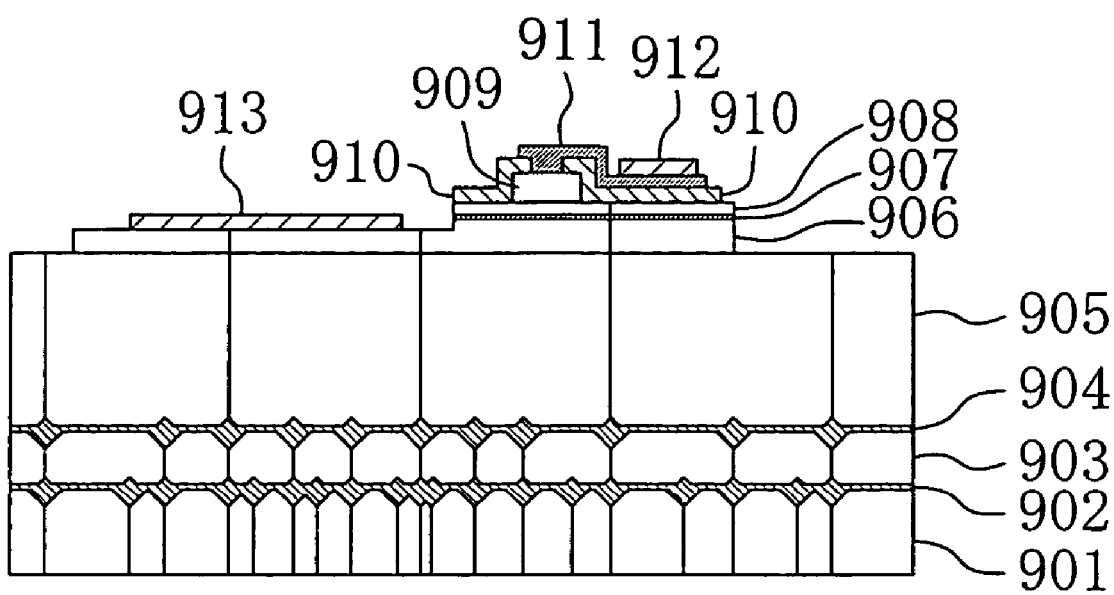
FIG. 9 is a cross-sectional view showing a structure of a semiconductor device according to a second embodiment of the present invention.

FIG. 9 is a cross-sectional view of the semiconductor device according to the second embodiment, specifically a nitride semiconductor laser device shown by way of example.

As shown in FIG. 9, a first oxide layer 902 is formed on a GaN substrate 901. Specifically, the first oxide layer 902 is formed in proximity to the upper portions of crystal defects present in the GaN substrate 901. The film thickness of the first oxide layer 902 is larger at a position closer to the upper portion of each of the crystal defects present in the GaN substrate 901 and decreases gradually with distance from the upper portion of the crystal defect. A first GaN layer 903 made of GaN is formed on the first oxide layer 902. Thus, with the first oxide layer 902 formed on the GaN substrate 901, the density of crystal defects is lower in the first GaN layer 903 than in the GaN substrate 901.

A second oxide layer 904 is formed on the first GaN layer 903. Specifically, a second oxide layer 904 is formed in proximity to the upper portions of crystal defects present in the first GaN layer 903. The film thickness of the second oxide layer 904 is larger at a position closer to the upper portion of each of the crystal defects present in the first GaN layer 903 and decreases gradually with distance from the upper portion of the crystal defect. A second GaN layer 905 made of GaN is formed on the second oxide layer 904. With the second oxide layer 904 further formed on the first GaN layer 903 having crystal defects at a reduced density, the crystal-defect density is lower in the second GaN layer 905 than in the first GaN layer 903, as described in the first variation of the first embodiment described above.

By thus repeatedly stacking unit structures each composed of an oxide layer formed on a GaN layer, a semiconductor device having crystal defects at a lower density with distance from the GaN substrate 901 can be implemented. Although FIG. 9 shows the structure obtained by stacking the two unit structures each composed of an oxide layer formed on a GaN layer, it is also possible to use a structure obtained by stacking a larger number of unit structures each composed of an oxide layer formed on a GaN layer or a structure constituted by only one unit structure composed of an oxide layer formed on a GaN layer.

An n-type clad layer 906 made of GaN doped with Si is formed on the second GaN layer 905. An active layer 907 composed of an AlGaN/GaN/InGaN multilayer film is formed on the n-type clad layer 906. A p-type clad layer 908 made of GaN doped with Mg is formed on the active layer 907. A p-type contact layer 909 made of GaN with a width of 1 to 2 μm is formed on the p-type clad layer 908, while an insulating film 910 composed of an $SiO_2$ film having a thickness of 300 nm and an opening is formed in such a manner as to catch the p-type contact layer 909 therein. A p-type electrode 911 having an ohmic property and a p-type pad 912 are formed over the insulating film 910 and the portion of the p-type contact layer 909 exposed in the opening of the insulating film 910. An n-type electrode 913 is formed on the n-type clad layer 906.

Thus, in accordance with the method for fabricating the semiconductor device of the second embodiment, the first oxide layer 902 is formed to cover the upper portions of crystal defects randomly appearing at the surface of the GaN substrate 901 so that the second GaN layer 903 located over the first oxide layer 902 is formed with a low-crystal-defect region by epitaxial lateral overgrowth (ELO). Since the first oxide layer 902 is formed selectively over the upper portions of randomly appearing crystal defects, the first oxide layer 902 for epitaxial lateral overgrowth (ELO) can be formed without necessitating mask formation. In addition, mask alignment performed in the conventional embodiments need not be performed since the crystal defects in the region located over the first oxide layer 902 formed over the upper portions of randomly appearing crystal defects have been reduced. Moreover, the use of the structure obtained by stacking the two unit structures each composed of an oxide layer formed on a GaN layer, as has been described above, implements a semiconductor device with a reduced crystal-defect region. Furthermore, the use of the GaN substrate 901 having a smaller number of crystal defects in the surface thereof than the sapphire substrate 101 used in the first embodiment further improves the characteristics of the device formed thereon.

A description will be given herein below to a comparison between the oxide layer formed on the GaN substrate and the oxide layer formed on the sapphire substrate with reference to FIGS. 10A and 10B.

Figure 10A:
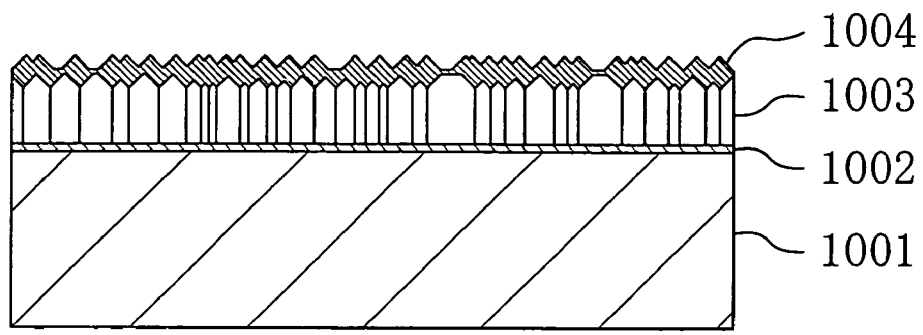
FIG. 10A is a cross-sectional view showing an oxide layer formed on a sapphire substrate and FIG. 10B is a cross-sectional view showing an oxide layer formed on a GaN substrate.
Figure 10B:
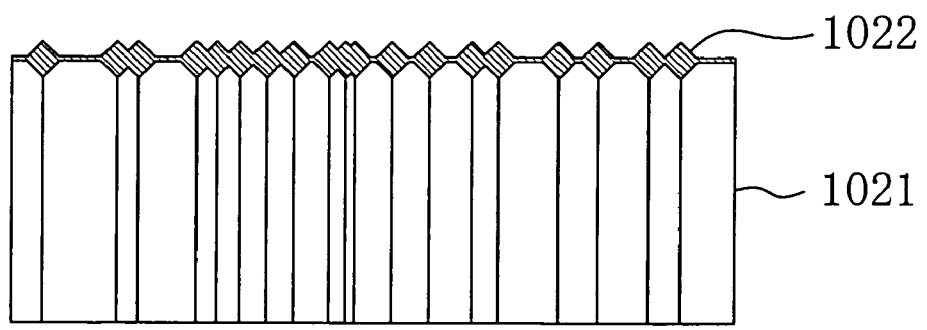

FIGS. 10A and 10B are cross-sectional views after the GaN layers were oxidized.

As shown in FIG. 10A, a first GaN layer 1003 is formed on a sapphire substrate 1001 with a buffer layer 1002 made of GaN interposed therebetween in the same manner as in the first embodiment. The density of crystal defects in the first GaN layer 1003 is about $1\times10^9$ cm$^{-2}$. An oxide layer 1004 composed of a Ga$_2$O$_3$ film obtained by oxidizing the first GaN layer 1003 is formed on the surface of the first GaN layer 1003. The density of crystal defects in the oxide layer 1004 is about $3\times10^6$ cm$^{-2}$. Since the oxide layer 1004 located over the portion of the first GaN layer 1003 in which the crystal defect present in the first GaN layer 1003 has reached the surface thereof is formed thick to protrude upward, projecting and depressed portions as many as the crystal defects are formed in the surface of the oxide layer.

On the other hand, an oxide layer 1022 is formed on a GaN substrate 1021 in the same manner as in the second embodiment, as shown in FIG. 10B. The density of the crystal defects at the surface of the GaN substrate 1021 is about $1\times10^7$ cm$^{-2}$. Thus, the density of crystal defects is lower at the surface of the GaN substrate 1021 than in the first GaN layer 1003 formed on the sapphire substrate 1001. Accordingly, the density of crystal defects in the oxide layer 1022 formed on the GaN layer 1021 is as low as about $1\times10^4$ cm$^{-2}$ and the area occupied by the portions of the oxide layer 1022 formed on the GaN substrate 1021 which are protruding upward can be reduced compared with the case where the oxide layer 1004 is formed on the sapphire substrate 1001. Therefore, the use of the GaN substrate further improves the characteristics of a device formed thereon than the use of the sapphire substrate.

Although the formation of the oxide layers (1004 and 1022) shown in FIGS. 10A and 10B may also be performed in an oxygen atmosphere, it is performed preferably in a water vapor atmosphere. This is because the surface of the oxide layer is more planarized through the oxidation in a water vapor atmosphere than through the oxidation in an oxygen atmosphere, as has been described above in the first embodiment.

Although the present embodiment has been described by using the GaN substrate as an example, a substrate which can be used in the present embodiment is not limited to the GaN substrate. Any substrate can achieve the same effects provided that the density of crystal defects in the surface of the substrate is reduced and a nitride semiconductor layer can be grown thereon. For example, it is also possible to use a sapphire substrate on which a GaN layer, an AlGaN layer, or an InGaN layer has been formed by crystal growth in accordance with the method shown in the first embodiment.

A description will be given herein below to variations of the second embodiment with reference to FIGS. 11 and 12.

Variation 1 of Embodiment 2

Figure 11:
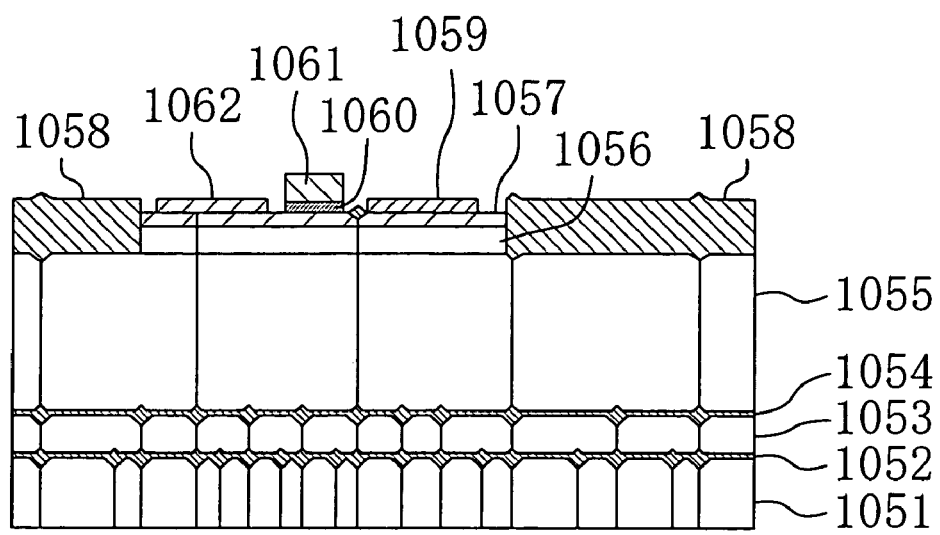
FIG. 11 is a cross-sectional view showing a structure of a semiconductor device according to a first variation of the second embodiment.

FIG. 11 is a cross-sectional view of a semiconductor device (hetero field effect transistor device) according to a first variation of the second embodiment.

Although the semiconductor device according to the second embodiment has been described above by using the semiconductor laser device as an example, even a hetero field effect transistor (HFET) device as shown in FIG. 11 is operable with a low leakage current and a high electric field if the active region thereof is formed in a low-crystal-defect substrate.

As shown in FIG. 11, a first oxide layer 1052 is formed on a GaN substrate 1051. Specifically, the first oxide layer 1052 is formed in proximity to the upper portions of crystal defects present in the GaN substrate 1051. The thickness of the first oxide layer 1052 is larger at a position closer to the upper portion of each of the crystal defects present in the GaN substrate 1051 and decreases gradually with distance from the upper portion of the crystal defect. A first GaN layer 1053 made of GaN is formed on the first oxide layer 1052. With the first oxide layer 1052 thus formed on the GaN substrate 1051, the density of crystal defects is lower in the first GaN layer 1053 than in the GaN substrate 1051, as has been described above in the first embodiment.

A second oxide layer 1054 is formed on the first GaN layer 1053. Specifically, the second oxide layer 1054 is formed in proximity to the upper portions of the crystal defects present in the first GaN layer 1053. The thickness of the second oxide layer 1054 is larger at a position closer to the upper portion of each of the crystal defects present in the first GaN layer 1053 and decreases gradually with distance from the upper portion of the crystal defect. A second GaN layer 1055 made of undoped GaN is formed on the second oxide layer 1054. With the second oxide layer 1054 further formed on the first GaN layer 1053 having crystal defects at a reduced density, the density of crystal defects is lower in the second GaN layer 1055 than in the first GaN layer 1053, as described above with reference to FIG. 9. By thus repeatedly stacking unit structures each composed of an oxide layer formed on a GaN layer, a semiconductor device having crystal defects at a lower density with distance from the GaN substrate 1051 can be implemented. Although FIG. 11 also shows the structure obtained by stacking the two unit structures each composed of an oxide layer formed on a GaN layer, similarly to FIG. 9, it is also possible to use a structure obtained by stacking a larger number of unit structures each composed of an oxide layer formed on a GaN layer or a structure constituted by only one unit structure composed of an oxide layer formed on a GaN layer. The foregoing structure is the same as that shown in FIG. 9.

A third GaN layer 1056 made of undoped GaN and an n-type channel layer 1057 made of GaN are formed on the second GaN layer 1055. An insulating layer 1058 obtained by thermally oxidizing (oxidation in, e.g., a water vapor atmosphere is preferred herein) the third GaN layer 1056 and the n-type channel layer 1057 are formed on both sides of the third GaN layer 1056 and the n-type channel layer 1057. A source electrode 1059 and a drain electrode 1062 are formed on the n-type channel layer 1057, while a gate electrode 1061 is formed thereon with an interlayer insulating film 1060 interposed therebetween. The insulating film 1058 also functions as an isolation. As the interlayer insulating film 1060, an insulating film obtained by oxidizing, e.g., a GaN layer in an oxygen atmosphere, preferably in a water vapor atmosphere, i.e., a gate oxide film can be used. This planarizes the surface of the gate oxide film and thereby improves the characteristics of the transistor.

The arrangement not only achieves the same effects as achieved by the semiconductor device according to the second embodiment but also improves the characteristics of a device formed on the insulating film 1058 in the subsequent steps because the insulating film 1058 has excellent surface planarity as a result of the thermal oxidation.

Even if a field effect transistor using an n-type channel layer made of GaN and an n-type barrier layer made of AlGaN instead of the third GaN layer 1056 and the n-type channel layer 1057, i.e., a hetero field effect transistor (HFET) device is used as the foregoing field effect transistor, the same effects as described above are achievable.

The same effects as described above are also achievable even when a bipolar transistor or a heterojunction bipolar transistor composed of a nitride semiconductor is used instead of the foregoing field effect transistor.

Variation 2 of Embodiment 2

Figure 12:
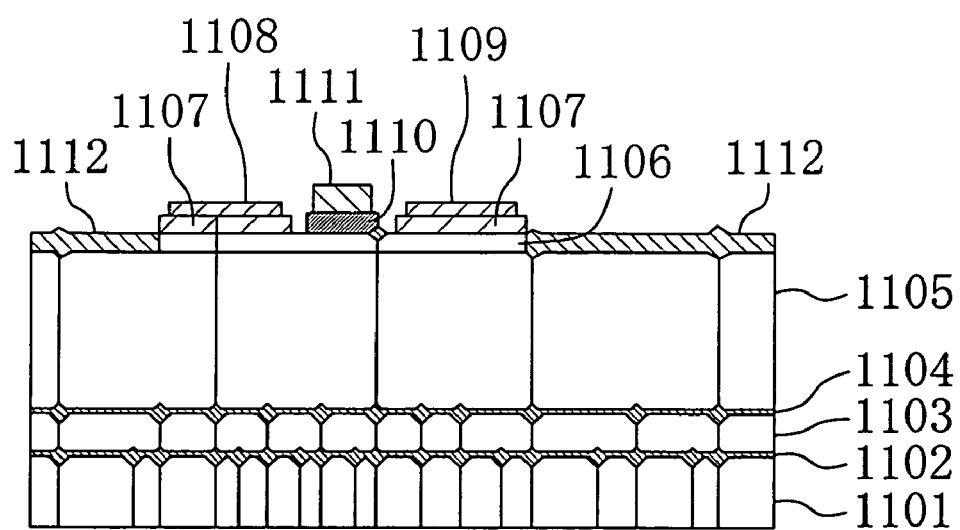
FIG. 12 is a cross-sectional view showing a structure of a nitride semiconductor device according to a second variation of the second embodiment.

FIG. 12 is a cross-sectional view of a semiconductor device (MOS transistor device) according to a second variation of the second embodiment.

As shown in FIG. 12, a first oxide layer 1102 is formed on a GaN substrate 1101. Specifically, the first oxide layer 1102 is formed in proximity to the upper portions of crystal defects present in the GaN substrate 1101. The thickness of the first oxide layer 1102 is larger at a position closer to the upper portion of each of the crystal defects present in the GaN substrate 1101 and decreases gradually with distance from the upper portion of the crystal defect. A first GaN layer 1103 made of GaN is formed on the first oxide layer 1102. With the first oxide layer 1102 thus formed on the GaN substrate 1101, the density of crystal defects is lower in the first GaN layer 1103 than in the GaN substrate 1101, as has been described above in the first embodiment.

A second oxide layer 1104 is formed on the first GaN layer 1103. Specifically, the second oxide layer 1104 is formed in proximity to the upper portions of crystal defects present in the first GaN layer 1103. The thickness of the second oxide layer 1104 is larger at a position closer to the upper portion of each of the crystal defects present in the first GaN layer 1103 and decreases gradually with distance from the upper portion of the crystal defect. A second GaN layer 1105 made of undoped GaN is formed on the second oxide layer 1104. With the second oxide layer 1104 further formed on the first GaN layer 1103 having crystal defects at a reduced density, the density of crystal defects is lower in the second GaN layer 1105 than in the first GaN layer 1103, as described above with reference to FIG. 9. By thus repeatedly stacking unit structures each composed of an oxide layer formed on a GaN layer, a semiconductor device having crystal defects at a lower density with distance from the GaN substrate 1101 can be implemented. Although FIG. 12 also shows the structure obtained by stacking the two unit structures each composed of an oxide layer formed on a GaN layer, similarly to FIG. 9, it is also possible to use a structure obtained by stacking a larger number of unit structures each composed of an oxide layer formed on a GaN layer or a structure constituted by only one unit structure composed of an oxide layer formed on a GaN layer. The structure described above is the same as that shown in FIG. 9.

A third GaN layer 1106 made of undoped GaN is formed on the second GaN layer 1105. A fourth GaN layer 1107 made of n-type GaN doped with Si is formed on the third GaN layer 1106. A source electrode 1108 and a drain electrode 1109 each made of a metal having an ohmic property are formed on the fourth GaN layer 1107. A gate oxide film 1110 obtained by oxidizing the fourth GaN layer 1107 or the third GaN layer 1106 is formed on the region of the fourth GaN layer 1107 which is located between the source electrode 1108 and the drain electrode 1109.

A gate electrode 1111 having a Schottky characteristic is formed on the gate oxide film 1110. Thus, the metal-oxide-film (MOS) transistor is surrounded by a third oxide layer 1112 (corresponding to the second oxide layer) composed of a $Ga_2O_3$ film which has been formed as an isolation layer by oxidizing (oxidation by water vapor is preferred) the n-type GaN layer or the undoped GaN layer. The density of crystal defects in each of the third GaN layer 1106 and the fourth GaN layer 1107 becomes, e.g., about $1\times10^4$ cm$^{-2}$ or less since it reflects the density of crystal defects in the second GaN layer 1105 formed thereunder. Therefore, a planar oxide layer can be formed through the oxidation of the third GaN layer 1106 or the fourth GaN layer 1107. This allows the formation of, e.g., an extremely fine electrode pattern on the oxide layer without incurring a broken line and implements a MOS transistor with excellent stability.

Embodiment 3

A semiconductor device according to a third embodiment of the present invention will be described with reference to FIG. 13.

Figure 13:
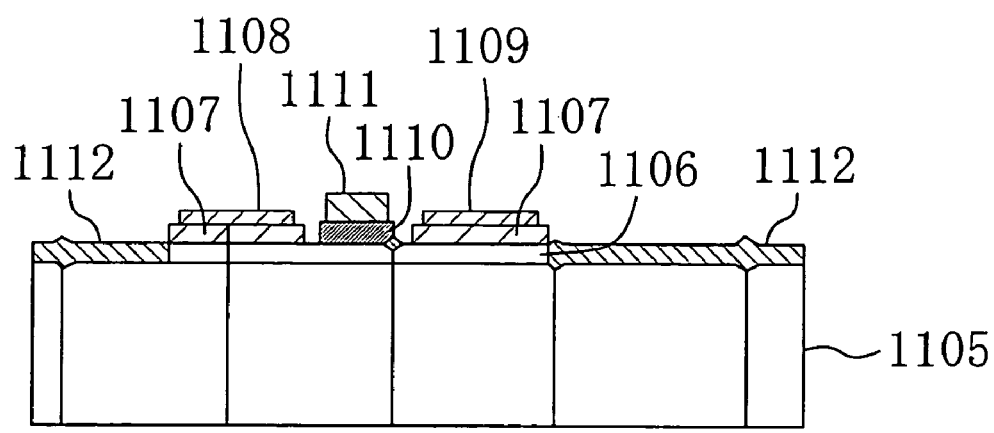
FIG. 13 is a cross-sectional view showing a structure of a nitride semiconductor device according to a third embodiment of the present invention.

FIG. 13 is a cross-sectional view of a semiconductor device (MOS transistor device) according to the third embodiment. In FIG. 13, the same reference numerals are retained to designate components which are the same as those of the semiconductor device shown in FIG. 12 and the description thereof will not be repeated herein below.

The following is a difference between the semiconductor device shown in FIG. 13 and the semiconductor device shown in FIG. 12.

In contrast to the semiconductor device shown in FIG. 12 in which the second GaN layer 1105 is formed on the layers (the GaN substrate 1101, the first oxide layer 1102, the first GaN layer 1103, and the second oxide layer 1104) each serving as an underlie with numerous defects, the semiconductor device shown in FIG. 13 is characterized in that, after the second GaN layer 1105 and the underlying layers shown in FIG. 12 are formed in succession, the layers (the GaN substrate 1101, the first oxide layer 1102, the first GaN layer 1103, and the second oxide layer 1104) each serving as an underlie with numerous defects are removed by, e.g., polishing or dicing. After the formation of the second GaN layer 1105, the same structure as shown in FIG. 12 is formed. Specifically, the third GaN layer 1106 made of undoped GaN is formed on the second GaN layer 1105. The fourth GaN layer 1107 made of n-type GaN doped with Si is formed on the third GaN layer 1106. A source electrode 1108 and a drain electrode 1109 each made of a metal exhibiting an ohmic property are formed on the fourth GaN layer 1107. The gate oxide film 1110 obtained by oxidizing the fourth GaN layer 1107 or the third GaN layer 1106 is formed on the region of the fourth GaN layer 1107 which is located between the source electrode 1108 and the drain electrode 1109.

The gate electrode 1111 having a Schottky characteristic is formed on the gate oxide film 1110. Thus, the metal-oxide-film (MOS) transistor is surrounded by the third oxide layer 1112 (corresponding to the second oxide layer) composed of a $Ga_2O_3$ film which has been formed as an isolation layer by oxidizing (oxidation by water vapor is preferred) the n-type GaN layer or the undoped GaN layer. The density of crystal defects in each of the third GaN layer 1106 and the fourth GaN layer 1107 becomes, e.g., about $1\times10^4$ cm$^{-2}$ or less since it reflects the density of crystal defects in the second GaN layer 1105 formed thereunder. Therefore, a planar oxide layer can be formed by oxidizing the third GaN layer 1106 or the fourth GaN layer 1107. This allows the formation of, e.g., an extremely fine electrode pattern on the oxide layer without incurring a broken line and implements a MOS transistor with excellent stability.

Thus, it is naturally implementable to use the second GaN layer 1105 having crystal defects at a reduced density by removing the layers underlying the second GaN layer 1105.

Variation of Embodiment 3

Figure 14:
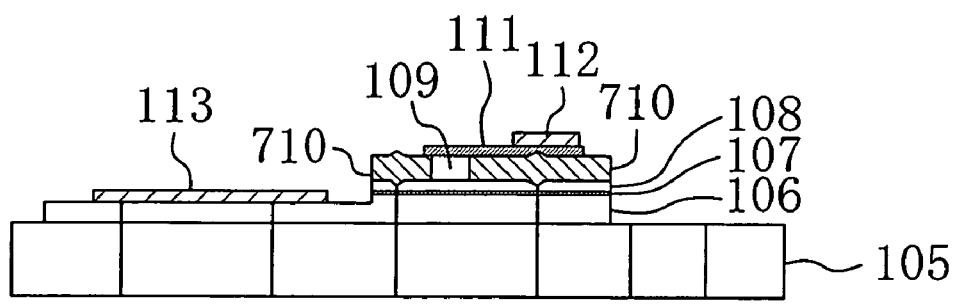
FIG. 14 is a cross-sectional view showing a structure of a nitride semiconductor device according to a variation of the third embodiment.
Figure 15:
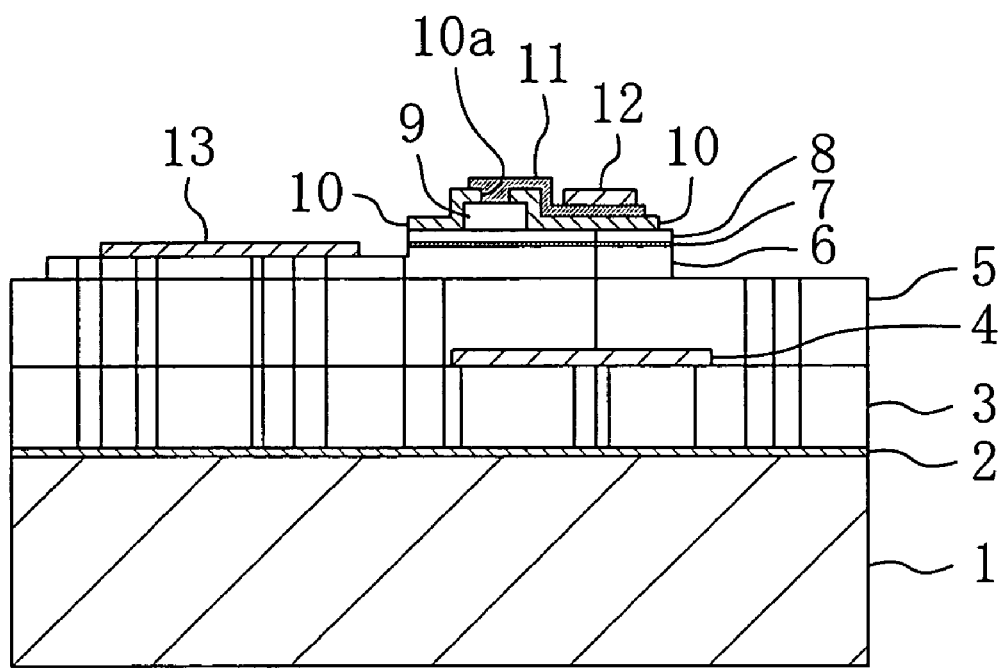
FIG. 15 is a cross-sectional view of a conventional nitride semiconductor device.

FIG. 14 is a cross-sectional view of a semiconductor device (semiconductor laser device) according to a variation of the third embodiment. In FIG. 14, the same reference numerals are retained to designate components which are the same as those of the semiconductor device shown in FIG. 7 and the description thereof will not be repeated herein below.

The following is a difference between the semiconductor device shown in FIG. 14 and the semiconductor device shown in FIG. 7.

In contrast to the semiconductor device shown in FIG. 7 in which the second GaN layer 105 is formed on the layers (the sapphire substrate 101, the buffer layer 102, the first GaN layer 103, and the first oxide layer 104) each serving as an underlie with numerous defects, the semiconductor device shown in FIG. 14 is characterized in that, after the second GaN layer 105 and the underlying layers shown in FIG. 7 are formed in succession, the layers (the sapphire substrate 101, the buffer layer 102, the first GaN layer 103, and the first oxide layer 104) each serving as an underlie with numerous defects are removed by, e.g., polishing or dicing. After the formation of the second GaN layer 105, the same structure as shown in FIG. 7 is formed.

Thus, it is naturally implementable to use the second GaN layer 105 having crystal defects at a reduced density by thus removing the layers underlying the second GaN layer 105. Since the insulating film 710 formed by oxidation using water vapor has a planarized surface, the characteristics of a device formed thereon can be improved.

Thus, the semiconductor device according to the present invention and the fabrication method therefor are useful for a laser device, a FET, a MOS transistor, and the like each using a nitride semiconductor.

What is claimed is:

1. A semiconductor device comprising:
   a substrate;
   a first Group III nitride semiconductor layer fanned on the substrate;
   a first oxide layer formed in proximity to upper portions of defects present in the first Group III nitride semiconductor layer; and
   a second Group III nitride semiconductor layer including a positive layer and formed over each of the first Group III nitride semiconductor layer and the first oxide layer,
   wherein the first oxide layer is obtained by oxidizing a portion of the first Group III nitride semiconductor layer which is present in proximity to the upper portions of defects,
   a portion of the first oxide layer that is located in proximity to the defects has a thickness greater than a portion of the first oxide layer that is located on a region having no defect, and
   the positive layer is an active layer composing a light emitting diode or a laser diode, or a channel layer of a field effect transistor.

2. The semiconductor device of claim 1, wherein the first oxide layer is obtained in an oxygen compound atmosphere.

3. The semiconductor device of claim 2, wherein the oxygen compound is water vapor.

4. The semiconductor device of claim 1, wherein
   the first Group III nitride semiconductor layer and the first oxide layer include a plurality of the first Group III nitride semiconductor layers and a plurality of the first oxide layers, respectively, which are formed in alternately stacked relation under the second Group III nitride semiconductor layer and
   a density of defects present in each of the plurality of the first Group III nitride semiconductor layers decreases gradually with an increase in distance of a position of each of the defects present therein from the substrate.

5. The semiconductor device of claim 1, further comprising:
   a second oxide layer obtained by oxidizing the second Group III nitride semiconductor layer in a water vapor atmosphere and located in proximity to the positive layer.

6. The semiconductor device of claim 5, wherein the second oxide layer is a current block layer formed to cover a circumference of the positive layer and thereby confine a current flowing in the positive layer.

7. The semiconductor device of claim 5, wherein the second oxide layer is a gate oxide film of a field effect transistor formed on the positive layer.

8. The semiconductor device of claim 1, wherein the substrate is made of sapphire, spinel, GaAs, Si, SiC, or GaN.

* * * * *